(12) United States Patent
Liu et al.

(10) Patent No.: US 6,583,668 B1
(45) Date of Patent: Jun. 24, 2003

(54) WIDEBAND VARIABLE GAIN AMPLIFIER WITH LOW POWER SUPPLY VOLTAGE

(75) Inventors: Cheh-Ming Jeff Liu, Thousand Oaks, CA (US); Kai-Chun Chang, Camarillo, CA (US)

(73) Assignee: Euvis, Inc., Westlake Village, CA (US)

( * ) Notice: Subject to any disclaimer, the term of this patent is extended or adjusted under 35 U.S.C. 154(b) by 0 days.

(21) Appl. No.: 10/140,444

(22) Filed: May 6, 2002

(65) Prior Publication Data (65)

Related U.S. Application Data
(60) Provisional application No. 60/290,463, filed on May 11, 2001.

(51) Int. Cl.[7] .................................................. H03F 3/45
(52) U.S. Cl. ....................................... 330/254; 330/292
(58) Field of Search ................................. 330/254, 292, 330/310, 311

(56) References Cited

U.S. PATENT DOCUMENTS

5,418,494 A 5/1995 Betti et al.

*Primary Examiner*—Henry Choe
(74) *Attorney, Agent, or Firm*—Michael Blaine Brooks, P.C.; Michael B. Brooks (57) ABSTRACT

A circuit for a variable gain amplifier is disclosed that uses two differential gain stages with independently adjustable bias currents. By changing the bias currents of the gain stages, the overall gain and phase of the amplifier can be adjusted over a wide range. Neither in-series nor in-parallel circuitry is required to implement or perform gain control. In addition to minimal part requirements for mechanization, the present invention features low power supply requirements while maintaining a wide operational bandwidth.

12 Claims, 6 Drawing Sheets

WIDEBAND VARIABLE GAIN AMPLIFIER WITH LOW POWER SUPPLY VOLTAGE

CROSS REFERENCE TO RELATED APPLICATIONS

This application claims priority from the following U.S. provisional Patent Application, the disclosure of which is incorporated by reference in its entirety for all purposes: U.S. Provisional Patent Application Ser. No. 60/290,463, Cheh-Ming Jeff Liu and Kai-Chun Chang entitled, "WIDEBAND VARIABLE GAIN AMPLIFIER WITH LOW POWER SUPPLY VOLTAGE," filed May 11, 2001.

BACKGROUND—Field of the Invention

The present invention relates to transistorized variable gain amplifiers particularly suited for adjustable gain control and automatic gain control.

BACKGROUND—Description of Prior Art

Typically, amplifiers achieve variable gain control by coupling a pair of gain stages where their outputs are connected oppositely and both gain stages share the same bias current. The bias current of both gain stages are then differentially controlled by a pair of in-series transistors. This topology is termed a Gilbert cell. Amplifiers exploiting a Gilbert cell can provide wide variations in gain. However, because of in-series control circuitry, the minimal rail-to-rail voltage is higher for the typical variable gain amplifier when compared to a conventional fixed-gain amplifier. Variable gain amplifiers exhibiting this higher rail-to-rail voltage inherently consume more power than the similarly sized fixed-gain amplifiers. Not surprisingly, the power consumption produces a practical need for an extra or enhanced power supply beyond that nominally required for conventional fixed-gain amplifiers.

Figure 1:
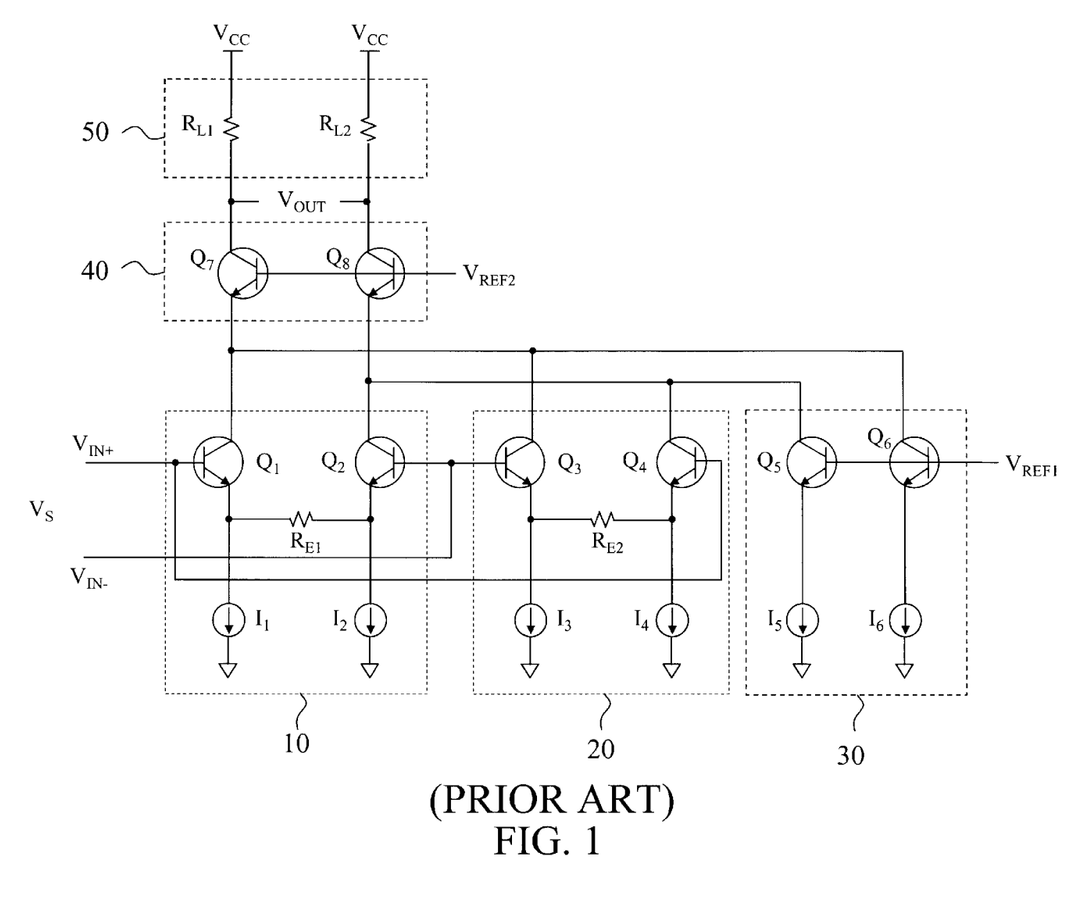
FIG. 1 illustrates prior art of a variable-gain amplifier with low supply voltage.

U.S. Pat. No. 5,418,494, issued May 23, 1995, to G. Betti, et al., and assigned to SGS-Thomson Microelectronics, S.r.l., discloses a variable gain amplifier with low power supply. FIG. 1 shows a variable gain amplifier with a fixed-gain amplifier 10, a variable gain amplifier 20, a gain control and stabilizing variable current generator 30, and a current-to-voltage converter 40. Due to the parallel configuration of fixed-gain amplifier 10 and variable-gain amplifier 20, the amplifier can be operated with a low power supply. However, in order to compensate DC current variation, the amplifier employs an in-parallel gain control and stabilizing variable current generator 30. This compensation circuitry can introduce additional parasitic effects that result in limiting the operational bandwidth. Moreover, due to the coupling of the three circuitries 10, 20 and 30, the isolation between the voltage inputs $V_S$ and control voltage $V_{REF1}$ is degraded. This mediocre isolation can cause serious stability problems when the variable amplifier is used in an automatic-gain-control (AGC) loop.

SUMMARY OF THE INVENTION

The present invention is embodied as a circuit for a variable gain amplifier that uses two differential gain stages with independently adjustable bias currents. By changing the bias currents of the gain stages, the overall gain and phase of the amplifier can be adjusted over a wide range. Neither in-series nor in-parallel circuitry is required to implement or perform gain control and thus the present invention obviates the need for relatively high rail-to-rail voltage. In addition to minimal part requirements for mechanization, the present invention features low power supply requirements while maintaining a wide operational bandwidth.

Because gain control in the present invention is performed by directly adjusting the bias currents of the gain modules with a minimal number of components required, this economy also eliminates the introduction of parasitic components to the gain modules. By the economy of components, particularly parasitic components, the bandwidth of the overall amplifier is not adversely affected by the direct gain control of the present invention. Moreover, without any extra DC compensation circuitry, the variable-gain amplifier of the present invention provides excellent isolation between the RF signals and the DC control signal thus increasing the system stability as used in an automatic-gain-control (AGC) loop.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENT

Figure 2:
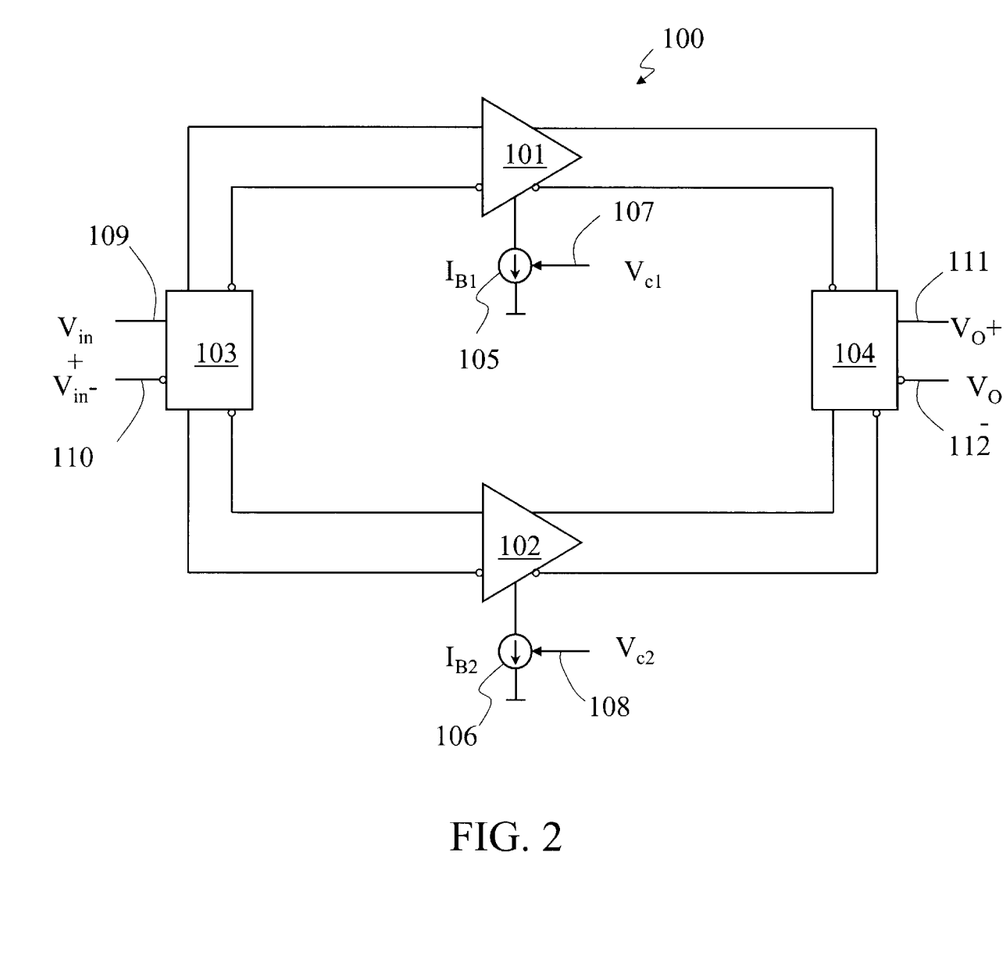
FIG. 2 is a functional diagram of a variable-gain amplifier.

Illustrated in FIG. 2 is a functional diagram of a variable gain amplifier 100 representing the preferred embodiment of the present invention. The amplifier 100 is composed of two differential gain modules 101 and 102, in which the bias currents $I_{B1}$ 105 and $I_{B2}$ 106 are adjusted independently by control signals $V_{c1}$ 107 and $V_{c2}$ 108 respectively. The input signals $V_{in}+$ 109 and $V_{in}-$ 110 are coupled to the inputs of gain modules 101 and 102 through a distributing module 103. The outputs of both gain modules 101 and 102 are combined by an optional combining module 104 and coupled to the output $V_o+$ 111 and $V_o-$ 112 in an opposite-phase configuration with respect to the configuration of the input coupling.

Figure 3A:
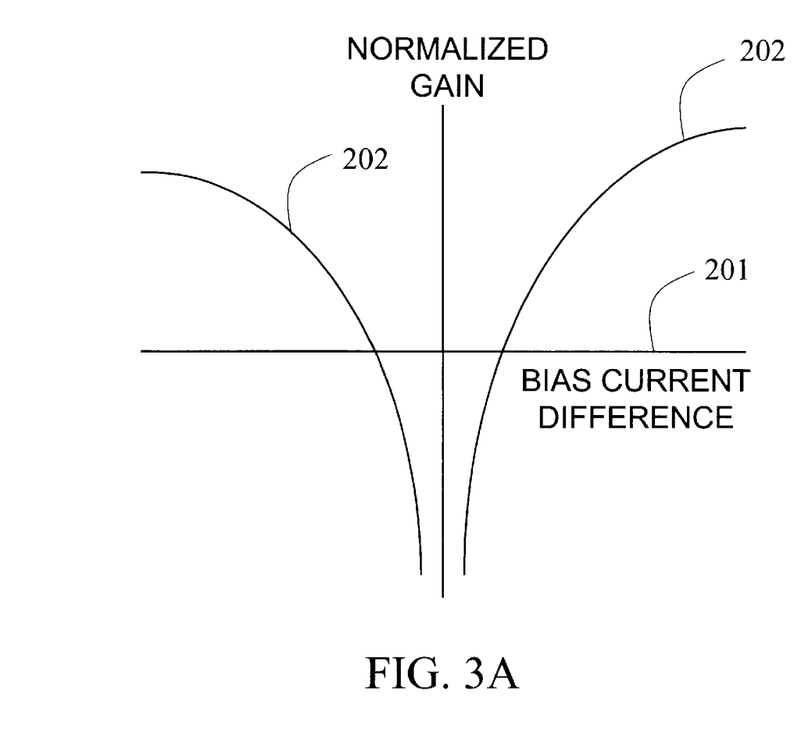
FIGS. 3A and 3B show normalized gain and phase characteristics respectively, each as functions of bias current difference.
Figure 3B:
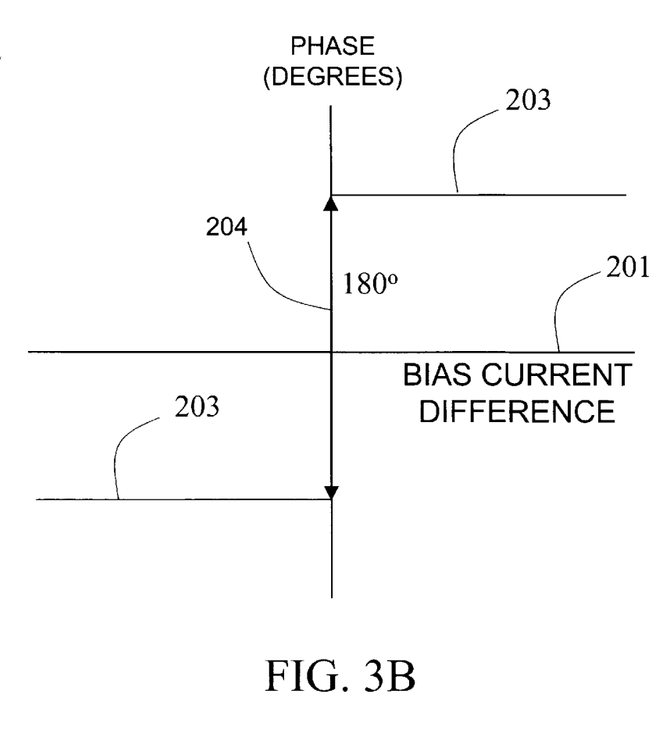

FIGS. 3A and 3B show normalized gain and phase characteristics versus differences in bias currents $I_{B1}$ 105 and $I_{B2}$ 106 of differential gain modules 101 and 102. Referring to FIG. 2 briefly, the first gain path is defined as being from the input of the amplifier 100 through the first gain module 101 to the output of the amplifier 100. Similarly, the second gain path is defined as being from the input of the amplifier 100, through the second gain module 102, and to the output of the amplifier 100. The relative phase between the first and second gains paths is out-phased, i.e., 180 degrees out of phase from one another. As illustrated generally in FIG. 3A, if $I_{B1}$ 105 grows larger in magnitude than $I_{B2}$ 106, the bias current difference (i.e., $I_{B1}-I_{B2}$ 201) increases positively and thus the overall gain 202 of the amplifier 100 increases monotonically. If $I_{B1}$ 105 grows smaller in magnitude than $I_{B2}$ 106, then the magnitude of the bias current difference 201 increases causing the overall gain 202 of amplifier 100 to increase monotonically in the other direction. As illustrated in FIG. 3B, the phase 203 of the amplifier 100 changes by 180 degrees 204 as the bias current difference 201 changes sign.

Figure 4:
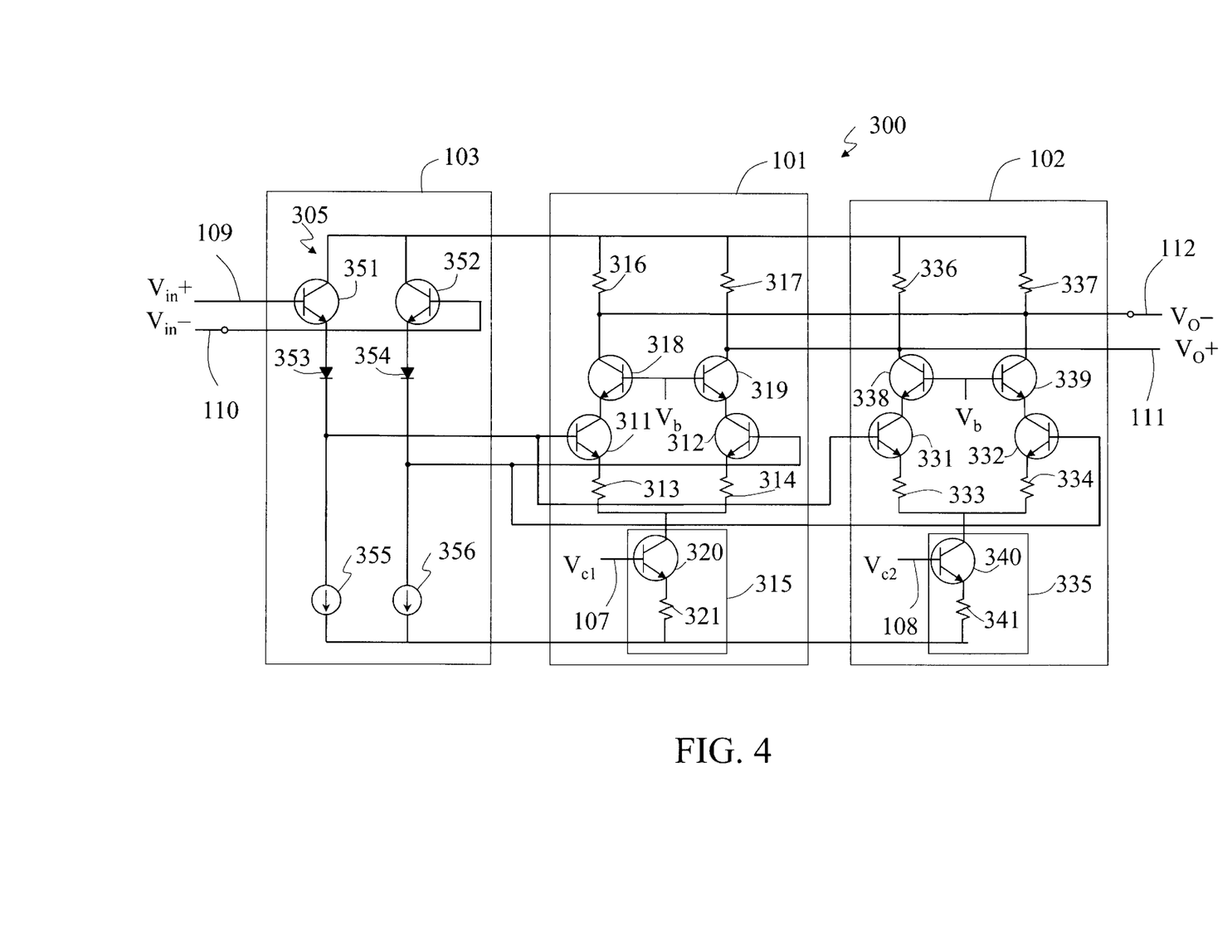
FIG. 4 is a circuit drawing representing the preferred embodiment of the present variable gain amplifier invention.

FIG. 4 illustrates a circuit 300 representing the preferred embodiment of the present variable gain amplifier invention. The circuit 300 comprises of a distributing module 103, a first differential gain module 101 and a second differential gain module 102. As the preferred alternative to a combining module 104, the outputs of the two gain modules 101 and 102 are wired directly together. The distributing module 103 consists of two emitter followers 305 as direct current (DC) level shifters with diodes 353 and 354 and respective current sources 355 and 356. Transistors 351 and 352 of the emitter followers 305 increase the input impedances of the amplifier and provide current gains for the differential gain modules 101 and 102 that follow. The first differential gain module 101 is comprised of common-emitter transistors 311 and 312, emitter degeneration resistors 313 and 314, a current generator 315, loads 316 and 317 and a pair of transistors 318 and 319 with a common-base configuration. The emitter degeneration resistors 313 and 314 increase the linearity and operational bandwidth of the gain stage 101. Transistors 318 and 319 reduce the capacitance of transistors 311 and 312 that would otherwise be present due to the Miller effect and by working this reduction, transistors 318 and 319 thereby increase the operational bandwidth of the gain stage 101. Similarly, the second gain module 102 consists of common-emitter transistors 331 and 332, emitter degeneration resistors 333 and 334, a current generator 335, loads 336 and 337 and a pair of transistors 338 and 339 with a common-base configuration. The bias currents $I_{B1}$ 105 and $I_{B2}$ 106 of the gain modules 101 and 102 are provided by transistors 320 and 340 with emitter resistors 321 and 341, respectively. The bias currents $I_{B1}$ 105 and $I_{B2}$ 106 are controlled by two independent control signals $V_{c1}$ 107 and $V_{c2}$ 108. Gain variation is achieved by changing the magnitudes of the bias currents $I_{B1}$ 105 and $I_{B2}$ 106 via the independent control signals $V_{c1}$ 107 and $V_{c2}$ 108 respectively.

According to the present invention, the amplifier gain can be adjusted between zero and the gains of the gain modules 101 and 102. Furthermore, the phase of the amplifier 300 can be modulated by the sign of the difference between two adjustable bias currents $I_{B1}$ 105 and $I_{B2}$ 106 of the gain modules 101 and 102. In comparing the present invention with prior approaches, neither additional in-series, nor additional in-parallel, gain-control transistors are required. This feature eliminates the need for a higher rail-to-rail voltage supply when compared with the typical Gilbert cell implementation. Due to the absence of the need for additional DC compensation transistors (FIG. 1) the bandwidth of the variable-gain amplifier 300, in accordance with the present invention, approaches that of the bandwidth of a fixed-gain amplifier. The present invention makes it practical to use the same power supply as a fixed-gain amplifier and thereby reduces the complexity and power consumption of an entire system availing itself of the herein described variable gain amplifier.

DETAILED DESCRIPTION OF AN ALTERNATIVE EMBODIMENT

Figure 5:
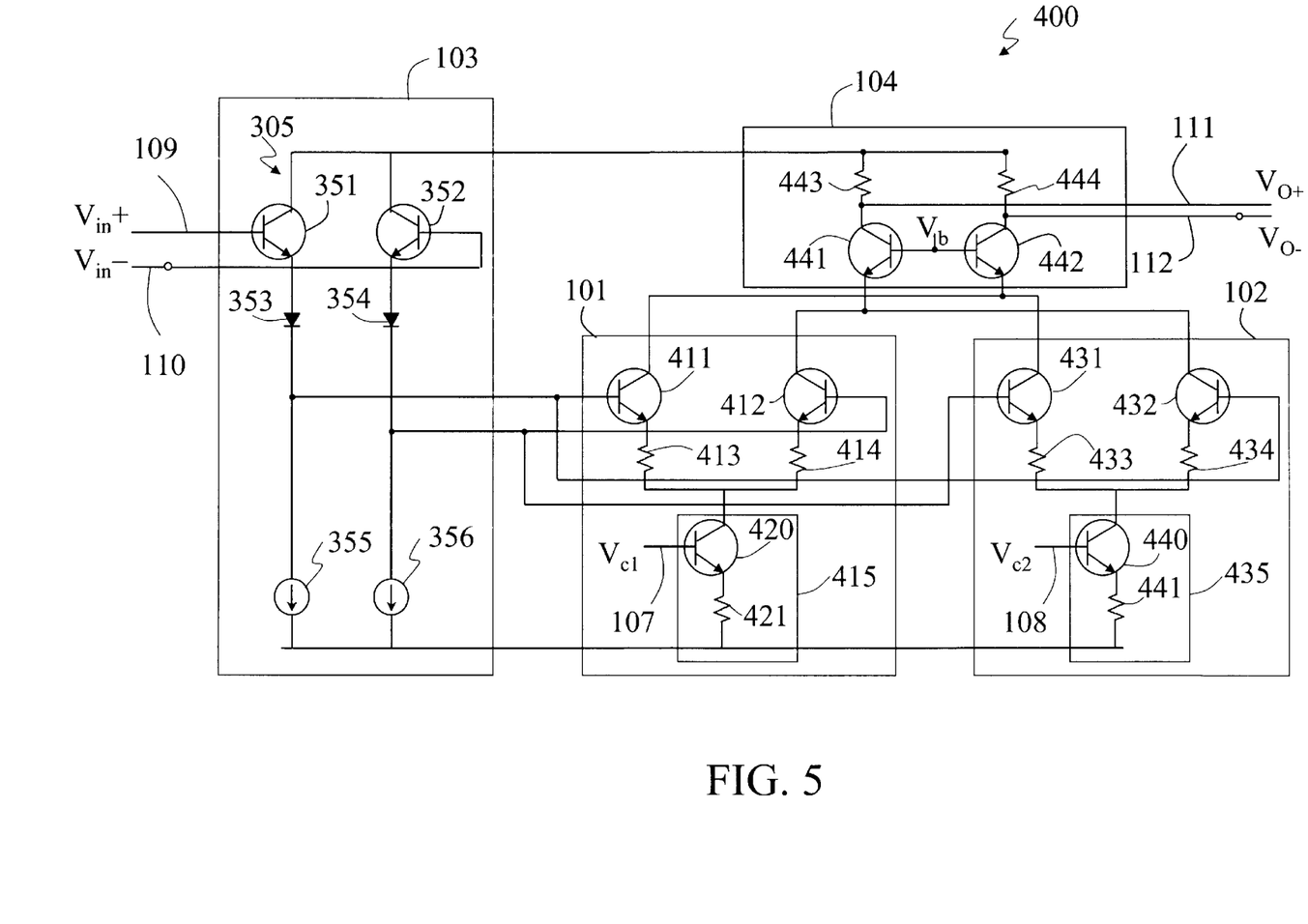
FIG. 5 is a circuit drawing illustrating the variable gain amplifier of an alternative embodiment of the instant invention with common-emitter gain modules and a common-base combining module.

FIG. 5 illustrates an alternative embodiment of the present invention. The first gain module 101 is comprised of common-emitter transistors 411 and 412, a current generator 415 and a pair of emitter degeneration resistors 413 and 414. Similarly, the second gain module 102 is comprised of common-emitter transistors 431 and 432, a current generator 435, and emitter degeneration resistors 433 and 434. The bias currents $I_{B1}$ 105 and $I_{B2}$ 106 of the gain modules 101 and 102 are provided by transistors 420 and 440 with emitter resistors 421 and 441, respectively. The combining module is comprised of a pair of common-base transistors 441 and 442 with resistive loads 443 and 444.

Figure 6:
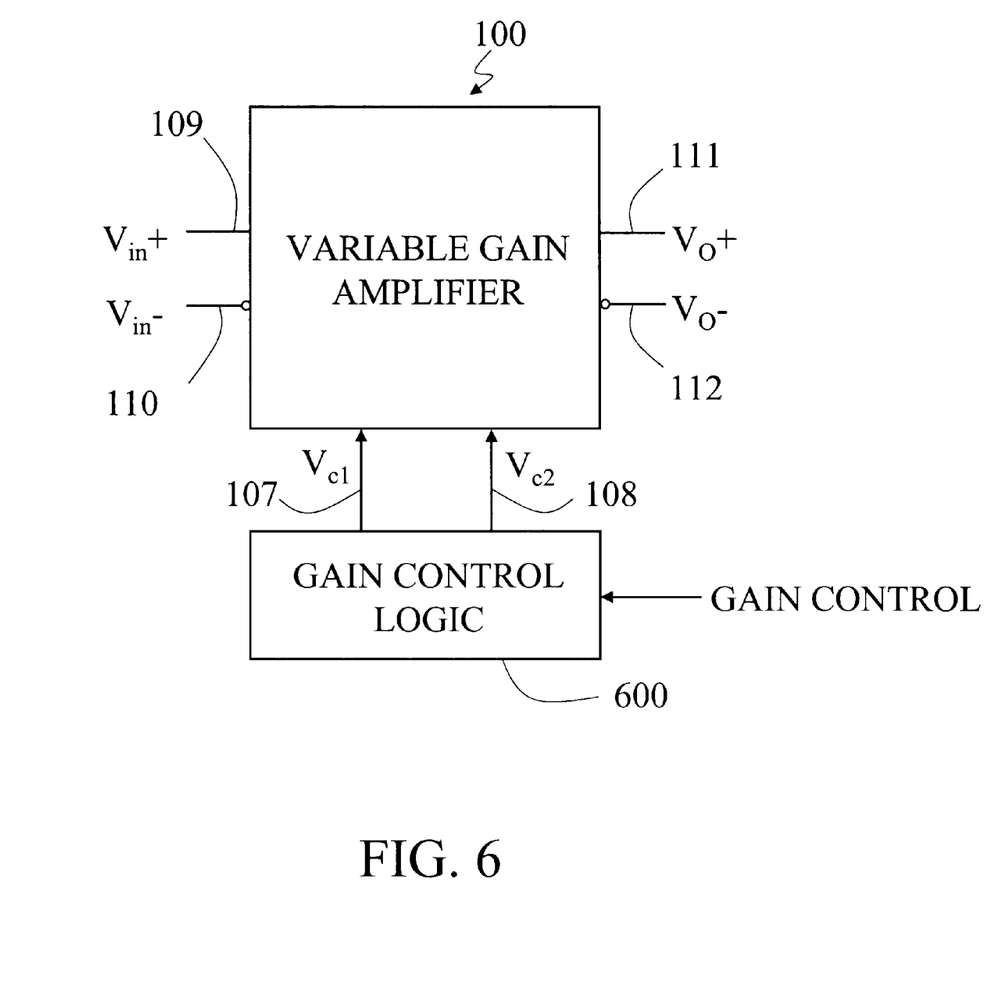
FIG. 6 shows a functional diagram of a variable gain amplifier of the instant invention with gain control logic.

Each bias current of the gain modules 101 and 102 can be adjusted independently according to the present variable gain amplifier invention. Since the overall gain of the invented variable gain amplifier is determined by the difference of controlled bias current $I_{B1}$ and $I_{B2}$, it is possible to achieve gain variation while maintaining the sum of the $I_{B1}$ and $I_{B2}$ as a constant. FIG. 6 shows an extension of the present invention with a gain control logic 600 providing the gain variation and maintaining same DC level at the outputs. As opposed to the prior art, in the gain modules 102 and 103, there is no extra control circuitry introduced to compensate the output DC level. Therefore, as compared to the prior art, the present invention can provide wider bandwidth and better isolation between the RF signals and the control signals, such as those used in an automatic-gain-control (AGC) loop.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A variable gain amplifier comprising:
   a. a distributing means for receiving an amplifier input signal and distributing said amplifier input signal to a first gain module and a second gain module, wherein the distributing means has supply potential; and
   b. a combining means for connecting outputs of said first and second gain modules and generating an amplifier output signal;

wherein said first gain module comprises:
(1) first and second common-emitter transistors;
(2) a first emitter degeneration means for increasing the linearity and operational bandwidth of said first gain module, the first emitter degeneration means being electrically associated with said first and second common-emitter transistors; and
(3) a first independently controlled current generator comprising:
(a) a first current-generator transistor, wherein the first current-generator transistor comprises (i) a base terminated to a first current adjusting control signal, (ii) a collector terminated to said first emitter degeneration means and (iii) an emitter; and
(b) a first current-generator emitter resistor having a first end and a second end, wherein the first end of the first current-generator emitter resistor is terminated to the emitter of said first current-generator transistor and the second end is terminated to the supply potential;

and said second gain module comprises:
(1) third and fourth common-emitter transistors;
(2) a second emitter degeneration means for increasing the linearity and operational bandwidth of said second gain module, the second emitter degeneration means being electrically associated with said third and forth common-emitter transistors; and
(3) a second independently controlled current generator comprising:
(a) a second current-generator transistor, wherein the second current-generator transistor comprises (i) a base terminated to a second current adjusting control signal, (ii) a collector terminated to said second emitter degeneration means and (iii) an emitter; and
(b) a second current-generator emitter resistor having a first end and a second end, wherein the first end is terminated to the emitter of said second current-generator transistor and the second end is terminated to the supply potential.

2. The variable gain amplifier of claim 1 wherein said first gain module further comprises first and second common-base transistors in cascode configurations with said first and second common-emitter transistors and said second gain module further comprises third and fourth common-base transistors in cascode configurations with said third and forth common-emitter transistors.

3. The variable gain amplifier of claim 2 wherein said first gain module further comprises first and second resistive loads and said second gain module further comprises third and fourth resistive loads.

4. The variable gain amplifier of claim 2 wherein the combining means comprises a pair of resistive loads receiving outputs of said first and second gain modules.

5. The variable gain amplifier of claim 2 further comprising gain control logic for providing gain variation and maintaining constant DC level at the outputs by adjusting, separately or in combination, said first current adjusting control signal and said second current adjusting control signal.

6. A variable gain amplifier comprising:
a. a distributing means for receiving an amplifier input signal and distributing said amplifier input signal to a first gain module and a second gain module, wherein the distributing means has supply potential; and
b. a combining means for connecting outputs of said first and second gain modules and generating an amplifier output signal;

wherein said first gain module comprises:
(1) first and second common-emitter transistors;
(2) first and second common-base transistors in cascode configurations with said first and second common-emitter transistors;
(3) a first emitter degeneration means for increasing the linearity and operational bandwidth of said first gain module, the first emitter degeneration means being electrically associated with said first and second common-emitter transistors; and
(4) a first independently controlled current generator comprising:
(a) a first current-generator transistor, wherein the first current-generator transistor comprises (i) a base terminated to a first current adjusting control signal, (ii) a collector terminated to said first emitter degeneration means and (iii) an emitter; and
(b) a first current-generator emitter resistor having a first end and a second end, wherein the first end of the first current-generator emitter resistor is terminated to the emitter of said first current-generator transistor and the second end is terminated to the supply potential;

and said second gain module comprises:
(1) third and fourth common-emitter transistors;
(2) third and fourth common-base transistors in cascode configurations with said third and fourth common-emitter transistors;
(3) a second emitter degeneration means for increasing the linearity and operational bandwidth of said second gain module, the second emitter degeneration means being electrically associated with said third and fourth common-emitter transistors; and
(4) a second independently controlled current generator comprising:
(a) a second current-generator transistor, wherein the second current-generator transistor comprises (i) a base terminated to a second current adjusting control signal, (ii) a collector terminated to said second emitter degeneration means and (iii) an emitter; and
(b) a second current-generator emitter resistor having a first end and a second end, wherein the first end is terminated to the emitter of said second current-generator transistor and the second end is terminated to the supply potential.

7. The variable gain amplifier of claim 6 wherein said first gain module further comprises first and second resistive loads and said second gain module further comprises third and fourth resistive loads.

8. The variable gain amplifier of claim 6 wherein the combining means comprises a pair of resistive loads receiving outputs of said first and second gain modules.

9. The variable gain amplifier of claim 6 further comprising gain control logic for providing gain variation and maintaining constant DC level at the outputs by adjusting, separately or in combination, said first current adjusting control signal and said second current adjusting control signal.

10. A variable gain amplifier comprising:
a. first and second gain modules wherein
i. said first gain module comprises:
(a) a first current generator receptive to a first current adjusting control signal;
(b) first and second common-emitter transistors; and
(c) a first emitter degeneration means for increasing the linearity and operational bandwidth of said first gain module;
(d) first and second common-base transistors in cascode configurations with said first and second common-emitter transistors; and ii. said second gain module comprises:
  (a) a second current generator receptive to a second current adjusting control signal;
  (b) third and fourth common-emitter transistors; and
  (c) a second emitter degeneration means for increasing the linearity and operational bandwidth of said second gain module;
  (d) second gain module further comprises third and fourth common-base transistors in cascode configurations with said third and fourth common-emitter transistors; and
b. a distributing means for receiving an amplifier input signal and distributing said amplifier input signal to said first and second gain modules; and
c. a combining means for connecting outputs of said first and second gain modules and generating an amplifier output signal.

11. The variable gain amplifier comprising first and second gain modules as claimed in claim 10 wherein the combining means comprises a pair of resistive loads receptive to outputs of said first and second gain modules.

12. The variable gain amplifier comprising first and second gain modules as claimed in claim 10 further comprising gain control logic for providing gain variation and maintaining constant DC level at the outputs by adjusting, separately or in combination, said first control signal and said second control signal.

* * * * *